US005798644A

United States Patent [19]

Eslambolchi et al.

[11] Patent Number: 5,798,644

[45] Date of Patent: Aug. 25, 1998

[54] METHOD AND APPARATUS FOR LOCATING BURIED CONVEYANCES USING LOCATING & CONFIRMATION SIGNALS WITH AN ARRAY OF SENSORS

[75] Inventors: Hossein Eslambolchi, Basking Ridge, N.J.; John Sinclair Huffman, McDonough, Ga.

[73] Assignee: AT&T Corp. Middletown, N.J.

[21] Appl. No.: 804,140

[22] Filed: Feb. 20, 1997

[51] Int. Cl.[6] .......... G01R 19/00; G01V 3/08; G01V 3/10

[52] U.S. Cl. .......... 324/326; 324/67

[58] Field of Search .......... 324/66, 67, 326, 324/228, 232, 327, 329, 539, 541, 543, 544

[56] References Cited

U.S. PATENT DOCUMENTS 5,644,237 7/1997 Eslambolchi et al. .......... 324/326

*Primary Examiner*—Sandra L. O'Shea

*Assistant Examiner*—Jay M. Patidar

*Attorney, Agent, or Firm*—Robert B. Levy

[57] ABSTRACT

Precise location of a buried utility conveyance (10) is achieved by impressing on the conveyance low frequency conveyance-locating and conveyance confirmation signals, the later being pulsed in a particular pattern unique to the conveyance to be located. A first sensor (22) detects a first magnetic field radiated by the conveyance upon receipt of the conveyance-locating signal. An array (24) of sensors ($26_1$–$26_5$) detects the second magnetic field radiated by the conveyance upon receipt of the conveyance-confirmation signal. A processor (32) coupled to the sensors ($26_1$–$26_5$) precisely vectors the location of the conveyance from the second magnetic field strength sensed by each sensor ($26_1$–$26_5$).

12 Claims, 2 Drawing Sheets

METHOD AND APPARATUS FOR LOCATING BURIED CONVEYANCES USING LOCATING & CONFIRMATION SIGNALS WITH AN ARRAY OF SENSORS

TECHNICAL FIELD

This invention relates to a technique for locating buried conveyances (i.e., pipes and/or cables), especially those situated within a duct.

BACKGROUND ART

Many utilities bury their pipes and cables (hereinafter, "conveyances") underground, both for cosmetic reasons, as well as to protect such conveyances from the elements. The utility undertaking burial records the location of the conveyance on a map to facilitate finding the conveyance at a later time. For example, contractors seeking to excavate in the vicinity of a conveyance will want to know the precise location of the conveyance to avoid any damage thereto. Unfortunately, most maps do not provide the requisite degree of precision to allow accurate location of buried utility conveyances.

The traditional approach to locating a buried utility conveyance has been to impress an alternating current signal on a metallic portion of the conveyance or on a separate associated conductor. A technician seeking to locate the conveyance utilizes a receiver to detect the signal radiated by the conveyance in response to the impressed signal. Unfortunately, stray electromagnetic signals, such as those radiated by other conveyances in proximity to the one of interest usually, prevents the technician from precisely locating the conveyance. As a consequence, the technician often has to physically uncover the conveyance by digging one or more holes.

In an effort to improve the conveyance locating process, locating and confirmation signals can be impressed on the conveyance or a metallic conductor associated therewith, as taught in U.S. Pat. No. 5,644,237, filed in the names of Hossein Eslambolchi and John Huffman, and assigned to AT&T, the present assignee (herein incorporated by reference). The locating signal (tone) comprises an RF signal whose frequency is specific to the utility responsible for the conveyance of interest. The confirmation signal (tone) comprises a near DC signal that is pulsed in a particular manner unique to the conveyance of interest. A technician seeking to locate a particular conveyance utilizes a first detector for detecting the locating signal. Once the technician has generally located the conveyance by detecting the region of greatest strength of the locating signal, the technician employs a second detector for detecting the strength of the confirmation signal to precisely locate the conveyance.

In practice, the locating technique described in U.S. Pat. No. 5,644,237 works well in areas where buried conveyances do not lie too closely spaced. Unfortunately, the above-locating technique, as well as those of the prior art, do not work especially well in situations where the conveyance of interest is buried in a duct in close proximity to other conveyances that also carry locating signals. The locating signals from adjacent conveyances in the same duct often interfere with the locating signal and/or confirmation signal carried by the conveyance of interest. Thus, locating the conveyance of interest electronically with high accuracy is often not possible. In some circumstances, the conveyance can only be located by visual inspection, necessitating excavation. Excavating city streets is very expensive and time consuming.

Thus, there is a need for a technique that can locate a buried utility conveyance, especially under circumstances where the conveyance is buried with others in close proximity.

BRIEF SUMMARY OF THE INVENTION

Briefly, in accordance with one aspect of the invention, a technique is provided for locating a utility conveyance, such as a pipe or cable, buried below the earth, and particularly, for locating a conveyance buried in proximity to other conveyances. To located a buried conveyance, a conveyance-locating signal is impressed on the conveyance, causing it to radiate a first magnetic field. A low-frequency conveyance-confirmation signal is also impressed on the conveyance. The conveyance-confirmation signal is pulsed in a particular pattern unique to the conveyance, causing it to radiate a second magnetic field unique to the conveyance. A first sensor senses the first magnetic field to locate the region where the first magnetic field has its greatest strength, thereby establishing the region where the conveyance is generally located. An array of second sensors, each typically a magnetometer, senses the second magnetic field within the region where the first magnetic field has its greatest strength. A processor or the like determines from the second magnetic field sensed by each of the second sensors, the location of the conveyance by vectoring the signals from the sensors.

DETAILED DESCRIPTION

Figure 1:
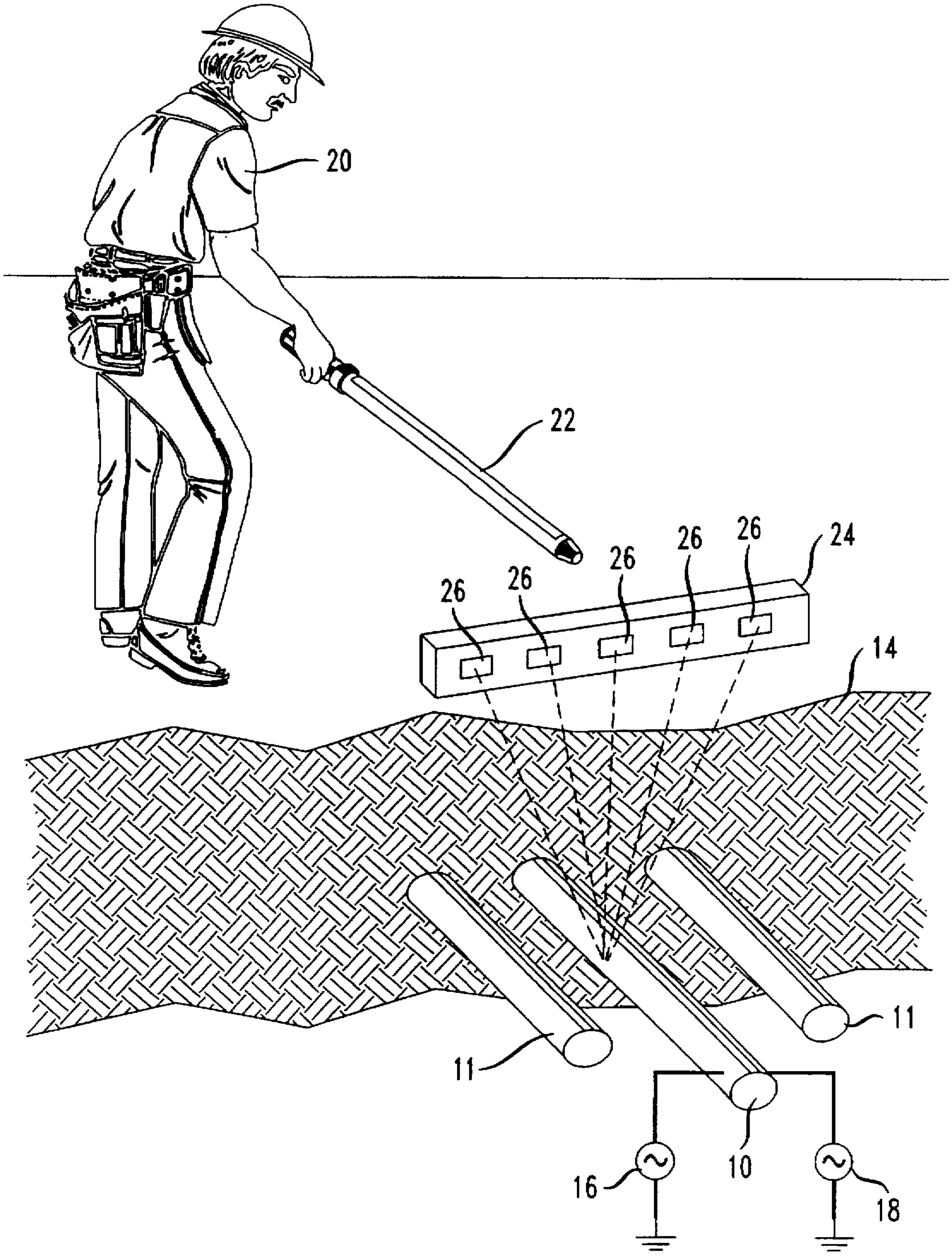
FIG. 1 is a block diagram illustrating the conveyance locating technique of the invention.

FIG. 1 illustrates a buried utility conveyance 10, illustratively identified as a cable although the conveyance could comprise a pipe. In the embodiment of FIG. 1, the conveyance 10 is buried with other conveyances 11—11 within a metallic duct (not shown) in the earth 12 a distance below the surface 14 of a city street. At various times, it may be necessary to excavate within the vicinity of the conveyance 10. For that reason, a knowledge of the precise location of the conveyance 10 is critical. A general knowledge of the location of the conveyance 10, as may be obtained by past electromagnetic signaling techniques, is generally not sufficient because such techniques may not provide sufficient accuracy. Even the technique disclosed in U.S. Pat. No. 5,644,237 (herein incorporated by reference) which provides improved accuracy over the prior art, may incur difficulty under circumstances where the conveyance 10 of interest is buried within a duct with the other conveyances 11—11. Electromagnetic interference from the other conveyances 11—11 often prevents precise location of the conveyance 10 of interest.

In accordance with the invention, a technique is provided for precisely locating the conveyance 10 of interest, even under circumstances where the conveyance lies in close proximity to others in a duct or the like. To locate the conveyance 10, a first signal generator 16 impresses a first alternating current signal, typically in the RF range, on the conveyance 10. The first signal, hereinafter referred to as a conveyance-locating signal, is impressed on the conveyance 10 for the purpose for establishing its location generally, as taught in our aforementioned now-allowed U.S. patent application 08/534,750. Generally, the conveyance-locating signal has a frequency that is unique to the utility responsible for the conveyance 10. For example, AT&T uses 220 and 440 Hz as its conveyance-locating frequencies. Other utilities use different frequencies.

To precisely locate the conveyance 10, a second signal generator 18 impresses a second signal, referred to as a conveyance-confirmation signal, on the conveyance. In accordance with the teachings of our now-allowed U.S. patent application 08/534,750, the conveyance-confirmation tone comprises a near DC signal that is pulsed in a particular manner unique to the conveyance.

The signal generators 16 and 18 have been depicted in FIG. 1 as separate units. In practice, a unitary device could be employed to generate both the conveyance-locating and the conveyance-confirmation signals. For example, the LMS 3 signal generator, manufactured by Radiodetection Ltd. of the United Kingdom, could be readily employed to generate the conveyance-locating and conveyance-confirmation signals as discussed above.

To locate the convenience 10 in accordance with the method of the invention, a technician 20 employs a first signal sensor 22, such as a model PDL3 signal receiver manufactured by Radiodetection, to detect the first magnetic radiated by the conveyance. As discussed, the conveyance-locating signal impressed by the signal generator 16 on the conveyance 10 causes the conveyance to radiate a first magnetic field. The technician 20 uses the first signal detector 22 to locate the region where the first magnetic field has its greatest strength. The region where the first magnetic field radiated by the conveyance 10 is strongest corresponds to the region where the conveyance is generally located.

Unfortunately, the location information obtained by way of the sensor 22 is only relative. For example, the actual location of the conveyance 10 may be several feet away from the location at which the sensor 22 detects the maximum field strength of the first magnetic field. To avoid unnecessary excavation, particularly in city streets, the conveyance-confirmation tone is utilized to precisely locate the conveyance 10. In practice, the second magnetic field radiated by the conveyance 10, as a result impressing the conveyance-confirmation signal on the conveyance, is relatively weak, and only radiates beyond the conveyance a very short distance. As taught in U.S. Pat. No. 5,644,237, the conveyance-confirmation signal is detected by inserting a sensor into the earth at successive locations within the region where the first magnetic field has its greatest strength. However, attempting to probe the earth 12 below the street surface 14 via the sensor in our now-allowed U.S. patent application 08/534,750 is impractical. Moreover, interference from the locating signals impressed on the other conveyances 11—11 often makes detecting the conveyance-confirmation tone by our past technique difficult.

Figure 2:
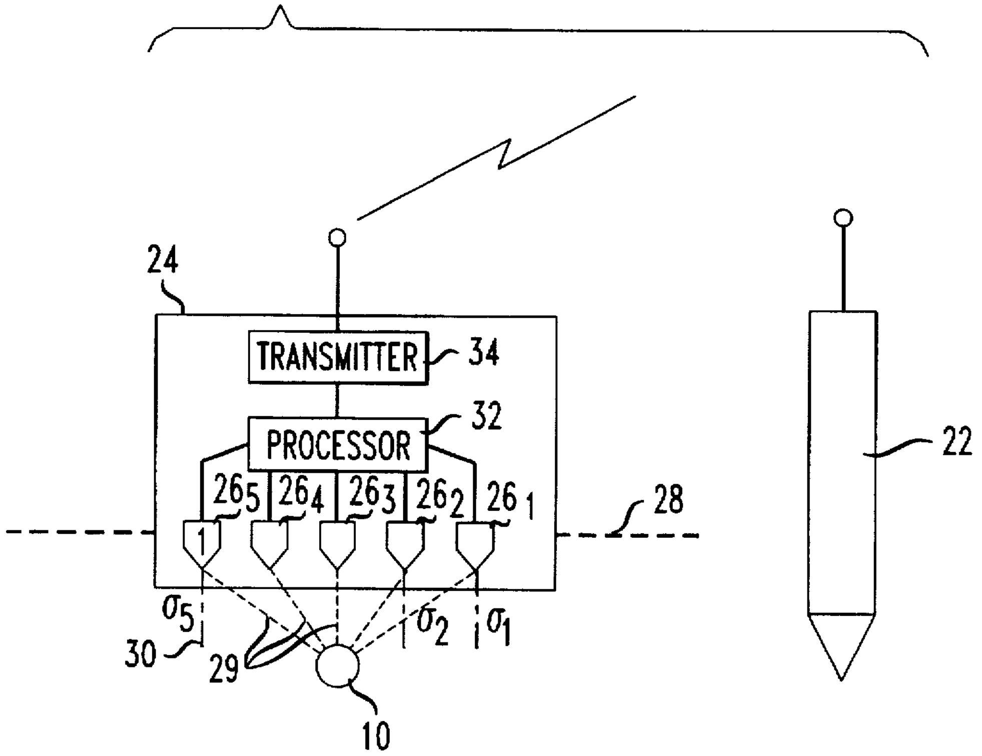
FIG. 2 is a schematic diagram of an apparatus, for use with the conveyance locating technique depicted in FIG. 1, for detecting a conveyance-confirmation signal and for vectoring the location of the conveyance.

Pursuant to the invention, an array 24 of sensors 26—26, described in greater detail with respect to FIG. 2, advantageously detects the second magnetic field radiated by the conveyance 10, notwithstanding any interference from the other conveyances 11—11. From the second magnetic field sensed by each of the sensors 26—26, the location of the conveyance 10 can be vectored very precisely.

In the illustrated embodiment depicted in FIG. 2, the array 24 comprises a set of sensors $26_1$–$26_5$, each typically a magnetometer tuned to the frequency of the second magnetic field radiated by the conveyance 10. Although the array 24 is depicted as containing five sensors, a greater or lessor number could be utilized although the fewer the number of sensors, the less the accuracy. The sensors $26_1$–$26_5$ are arranged in spaced-apart relationship along a longitudinal axis 28 of the array 24. When the array 24 is oriented orthogonal to the major axis of the conveyance 10, as seen in FIG. 2, each of the sensors $26_1$–$26_5$ has the capability of indicating the degree to which the second magnetic field, represented by field lines 29—29 radiating from the conveyance 10, is off the sensor's central axis 30. Thus, for example, the sensors 26, will detect the degree (as measured by the angle $\theta_1$) to which the second magnetic field lies off the axis of the sensor. Similarly, the sensor $26_2$ will detect the degree (as measured by the angle $\theta_2$) to which the second magnetic field lies off the axis of the sensor, and so on.

A processor 32, typically in the form of a microprocessor and associated memory, or a microcomputer, receives information from each of the sensors $26_1$–$26_5$ indicative of the degree to which the second magnetic field lies off the axis 30 of each sensor. The processor 32 collects such information from each of the sensors $26_1$–$26_5$ and uses the information to vector, that is, establish the precise location of the conveyance. An RF transmitter 34 coupled to the processor 32 serves to communicate the conveyance location information to the sensor 22 by RF signals for use by the technician 20 of FIG. 1.

A distinct advantage of employing the array 24 of sensors $26_1$–$26_5$ to precisely locate the conveyance 10 is that the sensors collectively detect the second magnetic field strength more accurately than would a single sensor. Moreover, the processor 32 can utilize the collective field strength information provided by the sensors $26_1$–$26_5$ to accurately locate the conveyance 10 in a way that has heretofore not been possible.

The foregoing describes a technique for precisely locating a buried conveyance 10 by using a first sensor 22 and an array 24 of sensors 26—26 to detect a conveyance-locating and a conveyance-confirmation signal, respectively, impressed on the conveyance.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. A method for precisely locating a utility conveyance buried below the earth, comprising the steps of:
   - impressing a conveyance-locating signal on the conveyance so that the conveyance radiates a first electromagnetic field;
   - impressing on the conveyance a low frequency conveyance-confirmation signal that is pulsed in a particular pattern unique to the conveyance to be located so that the conveyance radiates a second electromagnetic field unique to the conveyance;
   - sensing, via a first signal detector located above the earth, where the first electromagnetic field has its greatest strength to establish a region where the conveyance is generally located;
   - sensing, within the region where the first electromagnetic field has its greatest strength, the second magnetic field via each of an array sensors located above the earth such that the array is generally orthogonal to the conveyance; and
   - vectoring, from the second magnetic field sensed by each of the second sensors, the location of the conveyance.

2. The method according to claim 1 wherein the location of the conveyance is determined by establishing the degree to which the second magnetic field lies off axis from each sensor.

3. The method according to claim 1 wherein the precise location of the conveyance determined by the array of sensors is communicated to the first detector for use by a technician.

4. The method according to claim 3 wherein the precise location is communicated by RF signals.

5. Apparatus for precisely locating a utility conveyance buried below the earth comprising:

means for impressing a conveyance-locating signal on the conveyance so that the conveyance radiates a first electromagnetic field, and for impressing a low frequency conveyance-confirmation signal that is pulsed in a particular pattern unique to the conveyance to be located so that the conveyance radiates a second electromagnetic field unique to the conveyance;

a first signal detector located above the earth for sensing where the first field has its greatest strength to establish a region where the conveyance is generally located;

an array of second detectors, each detecting the presence of the second field; and means associated with and the second array of detectors and responsive to the presence of the second magnetic field detected by each detector for vectoring the location of the conveyance.

6. The apparatus according to claim 5 wherein each second detector comprises a magnetometer.

7. The method according to claim 5 wherein the means for vectoring the location of the conveyance comprises a microprocessor.

8. The apparatus according to claim 5 further including means for transmitting information from said means for vectoring the location of the conveyance to the first signal detector.

9. In combination with an apparatus for precisely locating a buried utility conveyance, comprising: means for impressing a conveyance-locating signal on the conveyance so that the conveyance radiates a first electromagnetic field, and for impressing a low frequency conveyance-confirmation signal that is pulsed in a particular pattern unique to the conveyance to be located so that the conveyance radiates a second electromagnetic field unique to the conveyance; and a first signal detector located above the earth for sensing where the first field has its greatest strength to establish a region where the conveyance is generally located, the improvement comprising:

an array of second detectors, each detecting the presence of the second field; and means associated with and the second array of detectors and responsive to the presence of the second magnetic field detected by each detector for vectoring the location of the conveyance.

10. The apparatus according to claim 9 wherein each second detector comprises a magnetometer.

11. The method according to claim 9 wherein the means for vectoring the location of the conveyance comprises a microprocessor.

12. The apparatus according to claim 9 further including means for transmitting information from said means for vectoring the location of the conveyance to the first signal detector.

* * * * *